US008828850B2

(12) United States Patent
Cheng et al.

(10) Patent No.: US 8,828,850 B2
(45) Date of Patent: Sep. 9, 2014

(54) REDUCING VARIATION BY USING COMBINATION EPITAXY GROWTH

(75) Inventors: Yu-Hung Cheng, Hsin-Chu (TW);
Chii-Horng Li, Jhu-Bei (TW);
Tze-Liang Lee, Hsin-Chu (TW);
Yi-Hung Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 311 days.

(21) Appl. No.: 13/030,850

(22) Filed: Feb. 18, 2011

(65) Prior Publication Data

US 2011/0287611 A1    Nov. 24, 2011

Related U.S. Application Data

(63) Continuation-in-part of application No. 12/784,344, filed on May 20, 2010.

(51) Int. Cl.
*H01L 21/20* (2006.01)
*H01L 21/36* (2006.01)

(52) U.S. Cl.
USPC .................................... 438/478; 257/E21.09

(58) Field of Classification Search
USPC .......................................... 438/166; 257/139
See application file for complete search history.

(56) References Cited

U.S. PATENT DOCUMENTS 8,299,564 B1 * 10/2012 Wu et al. ....................... 257/509
8,647,953 B2 * 2/2014 Liao et al. ..................... 438/300
2001/0045604 A1   11/2001   Oda et al.
2005/0079691 A1    4/2005   Kim et al.
2006/0038243 A1    2/2006   Ueno et al.
2006/0057821 A1    3/2006   Lee et al.
2006/0151776 A1    7/2006   Hatada et al.
2007/0045729 A1 *  3/2007   Hoentschel et al. .......... 257/344
2007/0054457 A1    3/2007   Ueno et al.
2007/0105331 A1    5/2007   Murthy et al.
2007/0131159 A1    6/2007   Kim et al.

(Continued)

FOREIGN PATENT DOCUMENTS

CN          1988110          6/2007

OTHER PUBLICATIONS

Ito, S., et al., "Pattern dependence in selective epitaxial $Si_{1-x}Ge_x$ growth using reduced-pressue chemical vapor deposition," J. Appl. Phys. 78(4), Aug. 15, 1995, American Institute of Physics, pp. 2716-2719.

(Continued)

*Primary Examiner* — Matthew Landau
*Assistant Examiner* — Igwe U Anya
(74) *Attorney, Agent, or Firm* — Slater and Matsil, L.L.P.

(57) ABSTRACT

A method for forming a semiconductor structure includes forming a gate stack over a semiconductor substrate in a wafer; forming a recess in the semiconductor substrate and adjacent the gate stack; and performing a selective epitaxial growth to grow a semiconductor material in the recess to form an epitaxy region. The step of performing the selective epitaxial growth includes performing a first growth stage with a first growth-to-etching (E/G) ratio of process gases used in the first growth stage; and performing a second growth stage with a second E/G ratio of process gases used in the second growth stage different from the first E/G ratio.

22 Claims, 13 Drawing Sheets

(56) References Cited

U.S. PATENT DOCUMENTS

| | | |
|---|---|---|
| 2007/0148919 A1 | 6/2007 | Lin et al. |
| 2007/0190730 A1* | 8/2007 | Huang et al. ............ 438/299 |
| 2007/0235802 A1* | 10/2007 | Chong et al. ............ 257/346 |
| 2008/0023773 A1 | 1/2008 | Shimamune et al. |
| 2008/0233722 A1* | 9/2008 | Liao et al. ............... 438/508 |
| 2008/0242037 A1* | 10/2008 | Sell et al. ................ 438/299 |
| 2008/0277699 A1 | 11/2008 | Chakravarthi et al. |
| 2009/0075029 A1 | 3/2009 | Thomas et al. |
| 2009/0258463 A1* | 10/2009 | Kim et al. ............... 438/142 |
| 2009/0283837 A1* | 11/2009 | Huebinger et al. ...... 257/369 |
| 2010/0035419 A1 | 2/2010 | Dube et al. |
| 2010/0093147 A1* | 4/2010 | Liao et al. ............... 438/300 |
| 2010/0105184 A1 | 4/2010 | Fukuda et al. |
| 2010/0148217 A1* | 6/2010 | Simonelli et al. ....... 257/192 |
| 2010/0167505 A1 | 7/2010 | Chew et al. |
| 2010/0264470 A1 | 10/2010 | Thirupapuliyur et al. |
| 2010/0295127 A1 | 11/2010 | Cheng et al. |
| 2011/0008951 A1* | 1/2011 | Chen et al. ............... 438/478 |
| 2011/0108894 A1 | 5/2011 | Sung et al. |
| 2011/0117732 A1 | 5/2011 | Bauer et al. |
| 2013/0252392 A1 | 9/2013 | Cheng et al. |

OTHER PUBLICATIONS

Bodnar, S., et al., "Selective Si and SiGe epitaxial heterostructures grown using an industrial low-pressure chemical vapor deposition module," J. Vac. Sci. Technol. B 15(3), May/Jun. 1997, American Vacuum Society, pp. 712-718.

Menon, C., "Loading effect in SiGe layers grown by dichlorosilane- and silane-based epitaxy," J. Appl. Phys. 90 (9), Nov. 1, 2001, American Institute of Physics, pp. 4805-4809.

Isheden, C., et al., "MOSFETs with Recessed SiGe Source/Drain Junctions Formed by Selective Etching and Growth," Electrochemical and Solid-State Letters, 7 (4), 2004, pp. G53-G55.

* cited by examiner

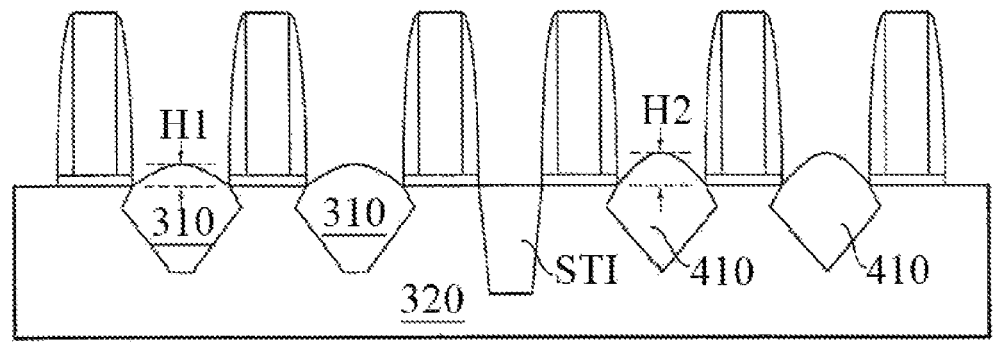
FIG. 1 (PIOR ART)
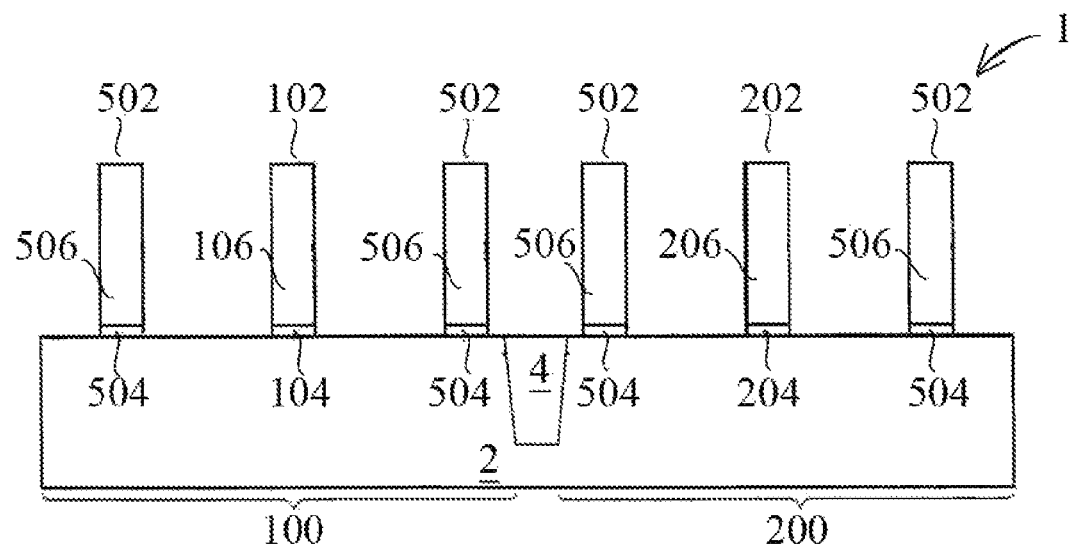
FIG. 2

US 8,828,850 B2

REDUCING VARIATION BY USING COMBINATION EPITAXY GROWTH

This application is a continuation-in-part of U.S. patent application Ser. No. 12/784,344, filed on May 20, 2010, entitled "Selective Etching in the Formation of Epitaxy Regions in MOS Devices," which application is hereby incorporated herein by reference.

BACKGROUND

To enhance the performance of metal-oxide-semiconductor (MOS) devices, stress may be introduced in the channel regions of the MOS devices to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

A commonly used method for applying compressive stress to the channel regions of PMOS devices is growing SiGe stressors in the source and drain regions. Such a method typically includes the steps of forming a gate stack on a silicon substrate, forming spacers on sidewalls of the gate stack, forming recesses in the silicon substrate and adjacent the gate spacers, and epitaxially growing SiGe stressors in the recesses. An annealing is then performed. Since SiGe has a greater lattice constant than silicon, it expands after annealing and applies a compressive stress to the channel region of the respective MOS device, which is located between a source SiGe stressor and a drain SiGe stressor.

A chip may have different regions having different pattern densities. Due to the pattern loading effect, the growth of SiGe stressors in different regions may have different rates. For example, FIG. 1 illustrates the formation of SiGe regions for PMOS devices in logic device region 300 and static random access memory (SRAM) region 400. Since the pattern density of the PMOS devices in SRAM region 400 is generally higher than the pattern density of the PMOS devices in logic region 300, and the sizes of SiGe regions 410 are typically smaller than the sizes of SiGe regions 310, SiGe regions 410 are grown faster than SiGe regions 310. As a result, height H2, which is the height of the portions of SiGe regions 410 over the top surface of substrate 320, may be significantly greater than height H1 of SiGe regions 310. For example, height H2 may be about 20 nm, while height H1 may be only about 5 nm, even if SiGe regions 310 and 410 are formed simultaneously. With the great height H2 and the small horizontal sizes, SiGe regions 410 may have pyramid top portions, with the slopes of the top portions being on (111) planes. This creates significant problems for the subsequent process steps such as the formation of source and drain silicide regions.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1 illustrates a cross-sectional view of an intermediate stage in the formation of a conventional integrated structure comprising PMOS devices, wherein SiGe stressors in different device regions have different heights due to the pattern-loading effect;

FIGS. 2 through 5A, FIGS. 7A through 7F, and FIGS. 10 and 11 are cross-sectional views of intermediate stages in the manufacturing of an integrated structure in accordance with various embodiments;

DETAILED DESCRIPTION OF ILLUSTRATIVE EMBODIMENTS

Figure 3:
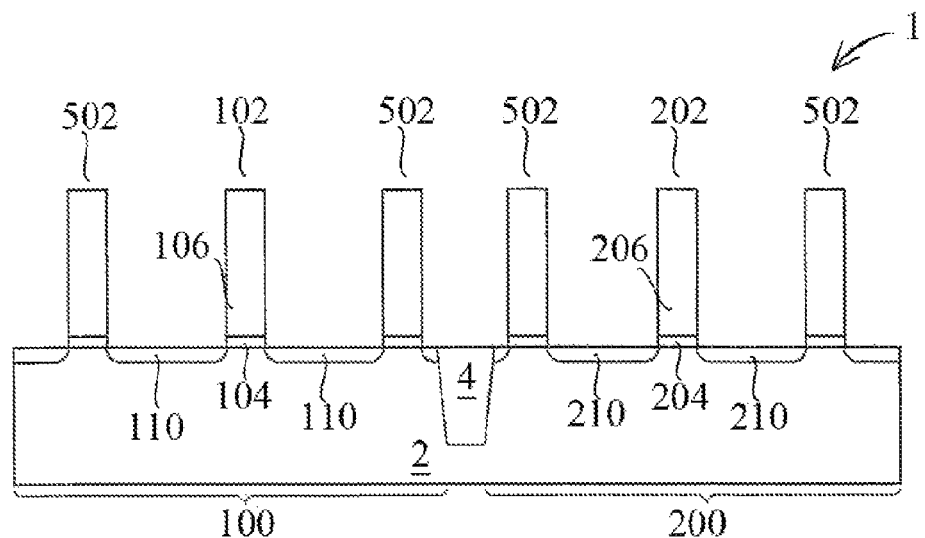

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming metal-oxide-semiconductor (MOS) devices with stressed channel regions is provided. The intermediate stages of manufacturing an embodiment are illustrated. Throughout the various views and illustrative embodiments, like reference numbers are used to designate like elements.

FIG. 2 illustrates substrate 2, which may be a portion of wafer 1 that comprises a first portion in device region 100 and a second portion in device region 200. In an embodiment, device region 100 is a logic device region, which may be, for example, a core circuit region, an input/output (I/O) circuit region, and/or the like, while device region 200 is a memory circuit region comprising memory cells such as static random access memory (SRAM) cells. Accordingly, device region 200 may be an SRAM region in an exemplary embodiment. In alternative embodiments, device region 100 is a region with a lower density of devices (such as transistors) than device region 200. The size of active region 101 in device region 100 may be greater than the size of active region 201 in device region 200 (please refer to FIG. 5B). Shallow trench isolation (STI) regions 4 are formed to isolate device regions 100 and 200. Substrate 2 may comprise bulk semiconductor material such as silicon, or have a composite structure, such as silicon-on-insulator (SOI) structure.

Gate stack 102 comprising gate dielectric 104 and gate electrode 106 is formed in device region 100 and over substrate 2. Gate stack 202 comprising gate dielectric 204 and gate electrode 206 is formed in device region 200 and over substrate 2. Gate dielectrics 104 and 204 may comprise silicon oxide or high-k materials having high k values, for example, higher than about 7. Gate electrodes 106 and 206 may include commonly used conductive materials such as doped polysilicon, metals, metal silicides, metal nitrides, and combinations thereof. Further, dummy gate stacks 502 are formed in both device region 100 and device region 200. Dummy gate stacks 502 include dummy gate dielectrics 504 and dummy gate electrodes 506, wherein dummy gate electrodes 506 may be electrically floating.

Referring to FIG. 3, lightly doped drain/source (LDD) regions 110 and 210 are formed, for example, by implanting a p-type impurity. Gate stacks 102 and 202 act as masks so that the inner edges of LDD regions 110 and 210 are substantially aligned with the edges of gate stacks 102 and 202, respectively.

Figure 4:
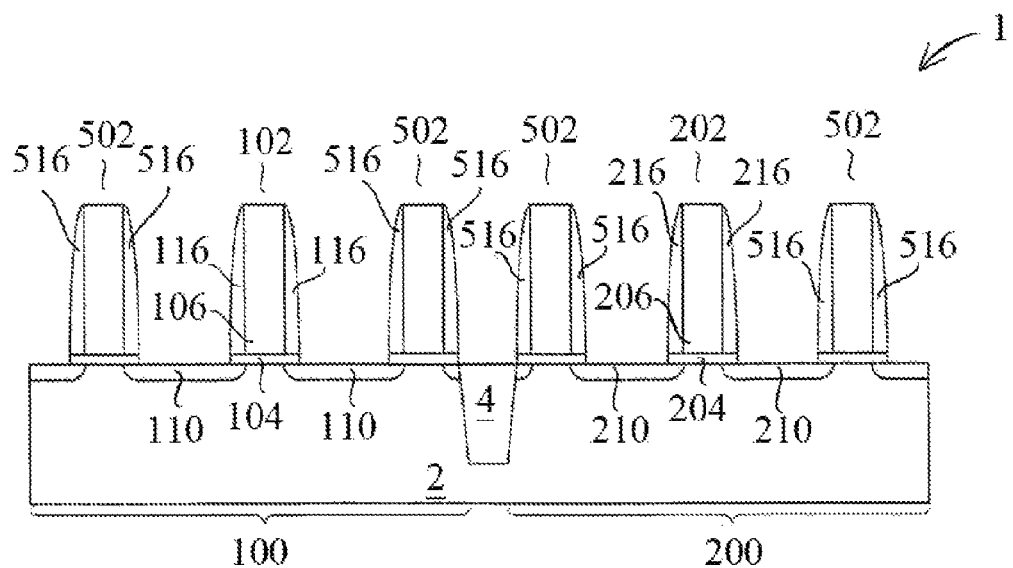

Referring to FIG. 4, gate spacers 116 and 216, and dummy gate spacers 516, are formed. In an embodiment, each of gate spacers 116, 216 and 516 includes a liner oxide layer and a nitride layer over the liner oxide layer. In alternative embodiments, each of gate spacers 116, 216 and 516 may include one or more layers, each comprising oxide, silicon nitride, silicon oxynitride (SiON) and/or other dielectric materials, and may be formed using commonly used techniques, such as plasma enhanced chemical vapor deposition (PECVD), low-pressure chemical vapor deposition (LPCVD), sub-atmospheric chemical vapor deposition (SACVD), or the like. The formation of gate spacers 116, 216 and 516 may include blanket forming gate spacer layers, and then performing etching steps to remove the horizontal portions of the gate spacer layers, so that the remaining vertical portions of the gate spacer layers form gate spacers 116, 216 and 516.

Figure 5A:
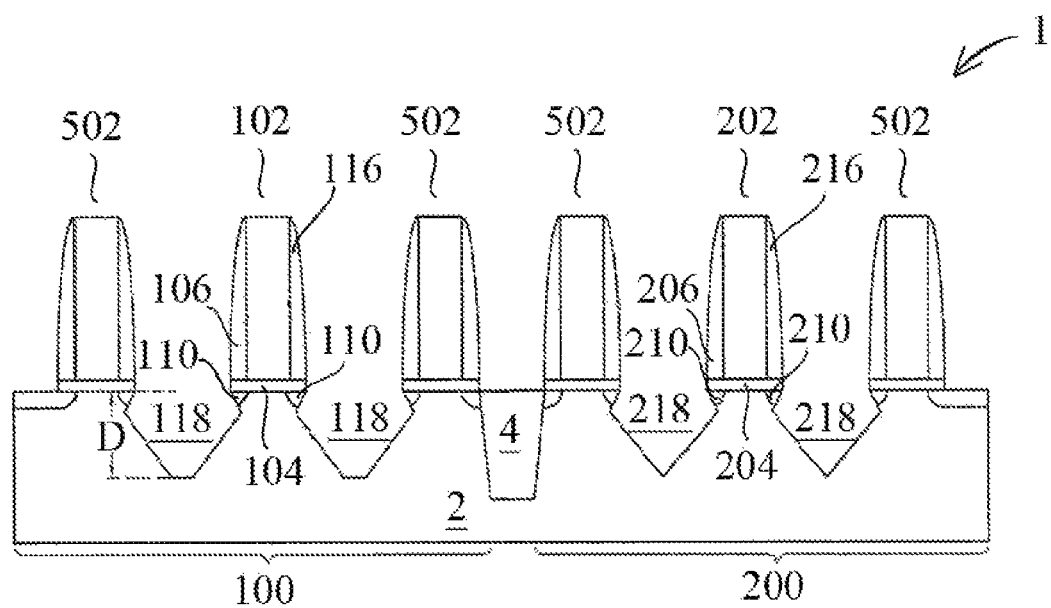

Referring to FIG. 5A, recesses 118 and 218 are formed by etching substrate 2 isotropically or anisotropically. Depth D of recesses 118 and 218 may be between about 500 Å and about 1000 Å, although different depth D may also be used. One skilled in the art will realize, however, that the dimensions recited throughout the description are merely examples, and will change if different formation technologies are used. In an embodiment, recesses 118 have a spear shape in the cross-sectional view, except the bottoms are flat.

In subsequent process steps, a semiconductor material, such as silicon germanium (SiGe), is epitaxially grown in recesses 118 and 218 by a selective epitaxial growth (SEG). The semiconductor material may have a greater lattice constant than silicon substrate 2. Desired impurities may be, or may not be, doped while the epitaxial growth proceeds. After being annealed, SiGe will try to restore its lattice constant, thus introducing compressive stresses to the channel regions of the resulting PMOS devices. Throughout the description, the SiGe epitaxy regions are alternatively referred to as SiGe stressors.

The precursor for growing SiGe may include growth gases such as germane ($GeH_4$, which provides germanium), dichloro-silane (DCS, which provides silicon), and the like. The silicon precursors may include $SiH_4$, $Si_xH_yCl_z$, and/or the like. Furthermore, a carbon containing silicon-source (such as Monomethylsilane ($SiCH_3$) or $SiCxH_{4-x}$) and/or a carbon containing germane-source (such as $GeCH_3$ or $GeC_xH_{4-x}$) may be added. An etching gas selected from HCl, HF, $Cl_2$, and combinations thereof, is introduced for removing the undesirable SiGe portions grown on dielectric materials such as gate spacers 116 and 216 and STI regions 4. Alternatively, the etching gas comprises a gas selected from the group consisting essentially of $C_xF_yH_z$, $C_xCl_yH_z$, $Si_xF_yH_z$, $Si_xCl_yH_z$, with values x, y, and z represent the percentage of the respective elements. In alternative embodiments, instead of forming SiGe films/regions, the epitaxy films may be silicon films/regions doped with phosphorus or boron (Si:B/Si:P), wherein $B_2H_6$ and $PH_3$ doping gases are used as precursors. The etching gas also has the effect of reducing pattern-loading effects. Accordingly, during the epitaxial growth, both growth and etch co-exist. In different epitaxy stages of the embodiments, the growth rate may be greater than or smaller than the etch rate, and hence the corresponding net effects may be growth or etching. In an exemplary embodiment, the selective epitaxy is performed using low pressure chemical vapor deposition (LPCVD) in a chamber, in which the total pressure of gases may be between about 1 torr and about 200 torrs, or between about 3 torrs and 50 torrs, and the temperature may be between about 400° C. and about 800° C. To determine the optimum conditions for growing SiGe, an etch-back to growth ratio (also referred to as etch-to-growth ratio, or E/G ratio) may be used to define the process conditions. The E/G ratio is the ratio of the partial pressure of etch-back gas(es) (such as HCl) to the weighted partial pressure of the growth gas(es) (such as $GeH_4$ and DCS). In an exemplary embodiment in which $GeH_4$, HCl, and DCS are used, the E/G ratio may be expressed as:

$$E/G\ \text{ratio} = P_{HCl}/(P_{DCS} + 100 \times P_{GeH4}) \quad [\text{Eq. 1}]$$

With $P_{HCl}$, $P_{DCS}$, and $P_{GeH4}$ being the partial pressures of HCl, DCS, and $GeH_4$, respectively. The value "100" represents an estimated weight of $GeH_4$. The accurate estimated weight of $GeH_4$ may need to be found through experiments. It was observed that $GeH_4$ has a much higher effect to the growth than DCS. In other words, to increase the growth rate, it is much more effective to introduce more $GeH_4$ than to introduce more DCS. The weight 100 thus indicates the significantly greater effect of $GeH_4$ over DCS, although an actual weight may be slightly different.

Alternatively, the E/G ratio may be expressed using flow rates of the process gases:

$$E/G\ \text{ratio} = FR_{HCl}/(FR_{DCS} + 100 \times FR_{GeH4}) \quad [\text{Eq. 2}]$$

With $FR_{HCl}$, $FR_{DCS}$, and $FR_{GeH4}$ being the flow rates of HCl, DCS, and $GeH_4$, respectively. The value "100" again represents an estimated weight of $GeH_4$. The accurate estimated weight of $GeH_4$ may need to be found through experiments. At a constant temperature and a constant total volume of HCl, DCS, and $GeH_4$, Equations 1 and 2 are equivalent. Alternatively stating, if the temperature and the total volume of HCl, DCS, and $GeH_4$ are constant, the E/G ratio expressed using Equation 1 may be converted to (or from) the E/G ratio expressed using Equation 2 by simply changing the symbols "P" to (or from) the symbols "FR." If, however, the temperature and/or the total volume are not constant, the E/G ratio expressed using Equation 1 may not be converted to (or from) the E/G ratio expressed using Equation 2 by simply changing the symbols "P" to (or from) the symbols "FR," and further modification, such as the modification of the estimated weight of $GeH_4$ may be needed. Furthermore, the if the temperature and/or the total volume are not constant, the E/G ratio calculated using Equation 1 may be slightly different from the E/G ration calculated using Equation 2.

Figure 5B:
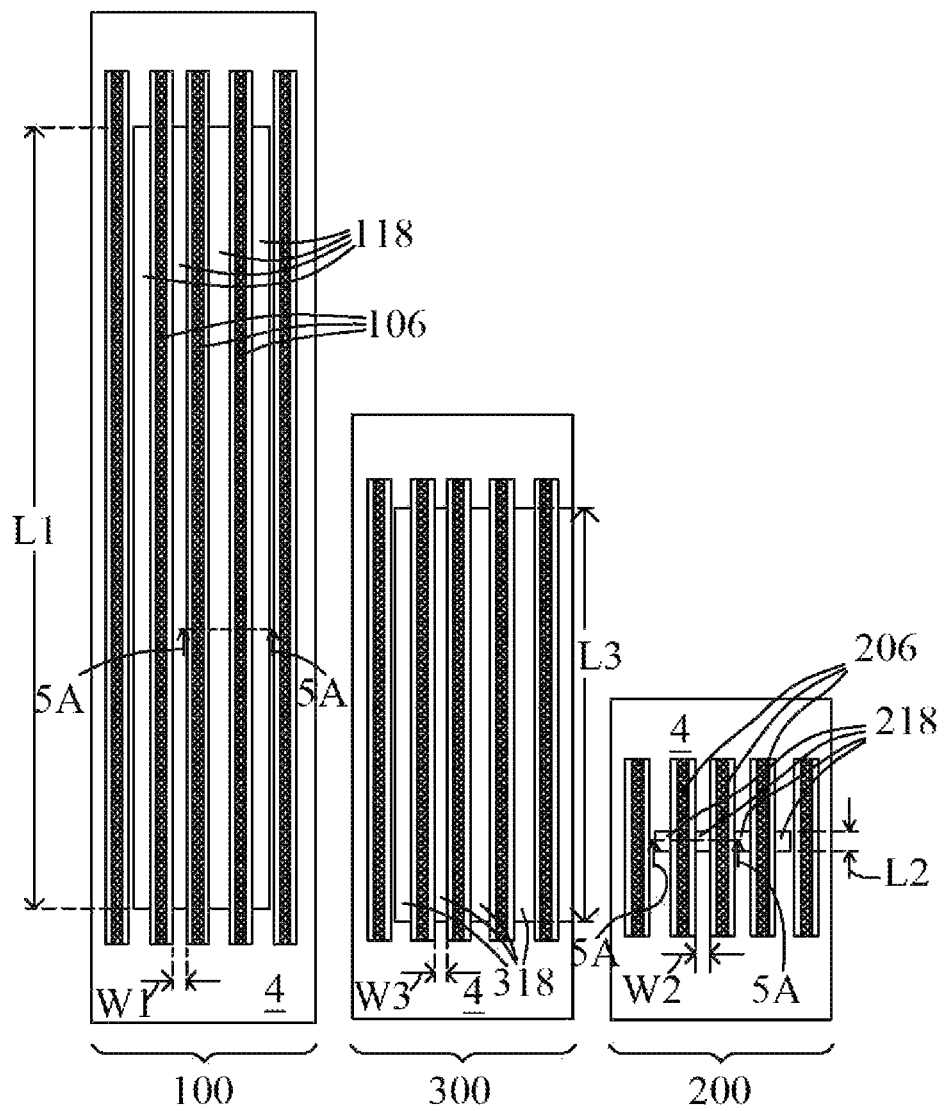
FIG. 5B illustrates a top view of device regions and recesses formed in the device regions.

FIG. 5B illustrates a top view of device regions 100 and 200. In addition, region 300 is also illustrated. The cross-sectional view of the structure shown in FIG. 5A may be obtained from the plane crossing lines 5A-5A in FIG. 5B. In an embodiment, recesses 118 as in FIG. 5A represent the largest recesses in a wafer in which SiGe is to be grown, while recesses 218 represent the smallest recesses in the same wafer in which SiGe is to be grown, although recesses 118 and 218 may represent any recesses have other sizes. In an exemplary embodiment, as shown in FIG. 5B, recesses 118 in device region 100 have length L1 equal to about 5.0 μm and width W1 equal to about 0.05 μm. Recesses 218 in device region 200 have length L2 equal to about 0.05 μm and width W2 equal to about 0.05 μm. Recesses 318 have sizes between the sizes of recesses 118 and 218. In an example, recesses 318 in device region 300 have length L3 equal to about 1.0 μm and width W3 equal to about 0.05 μm. It is expected that if the SiGe regions formed in recesses 118 and 218 have substantially the same thickness, the SiGe regions formed in recesses 318 will also have the same thickness as the SiGe regions formed in recesses 118 and 218.

Figure 6A:
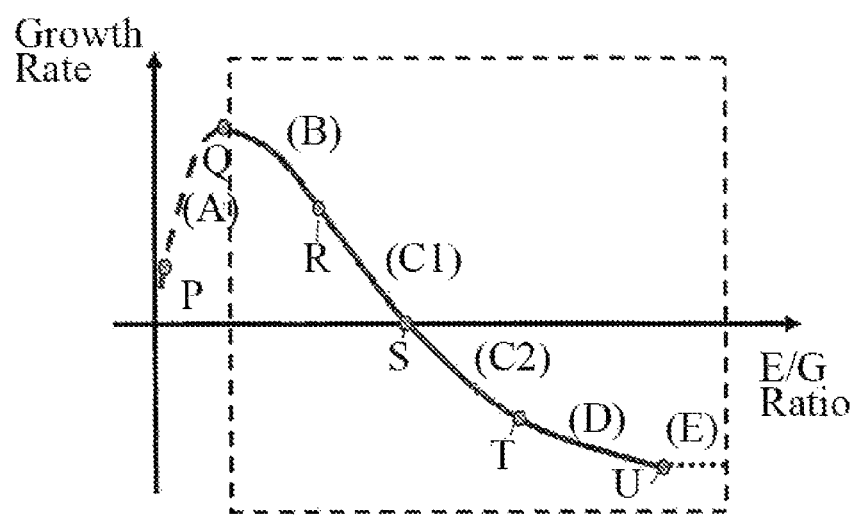
FIG. 6A illustrates growth rates of epitaxy regions as a function of E/G ratios.
Figure 6B:
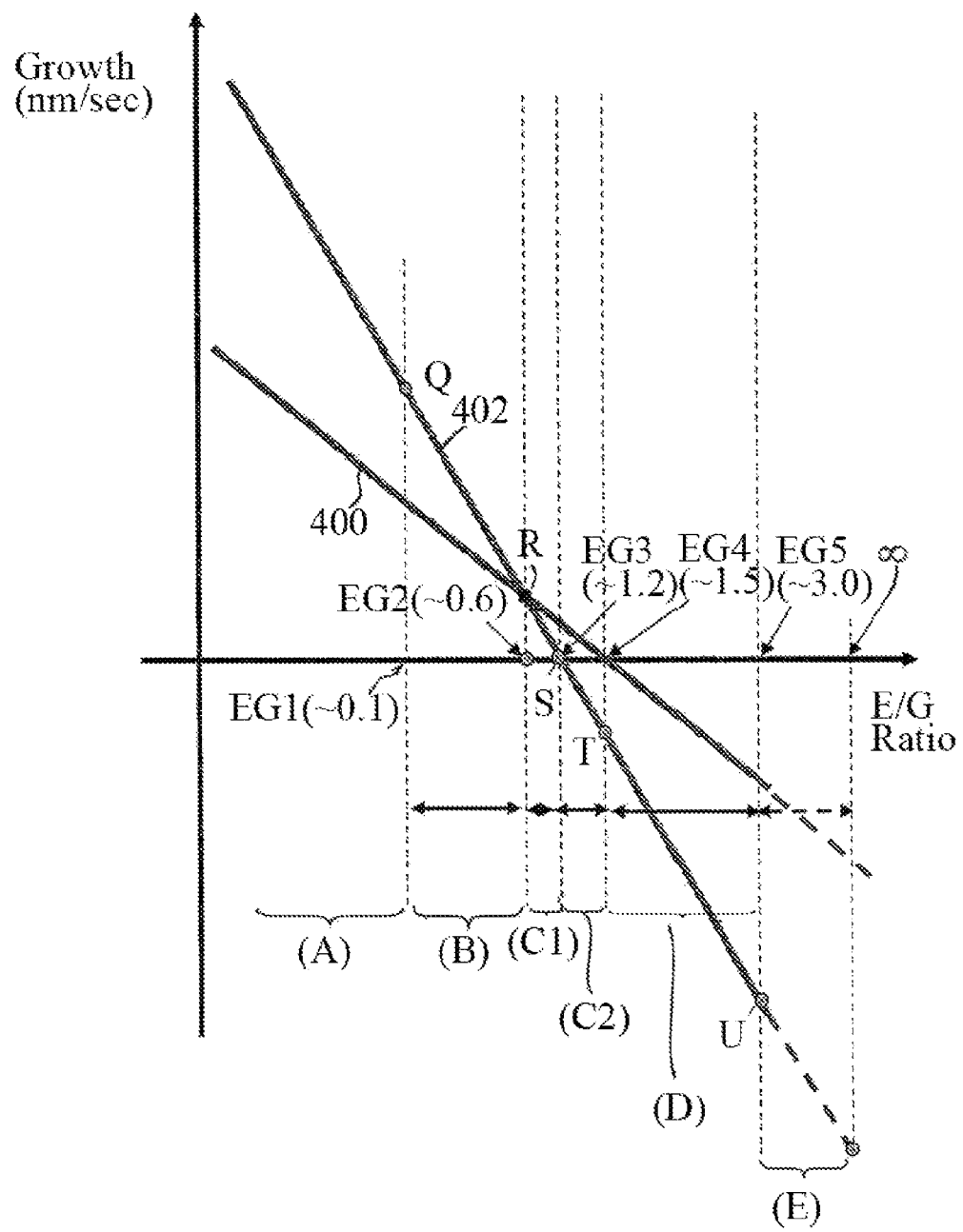
FIG. 6B schematically illustrates growth rates of epitaxy regions as a function of erase-to-growth (E/G) ratios, wherein the growth rates in devices regions 100 and 200 as shown in FIG. 5B are illustrated.

FIG. 6A illustrates the growth rates of epitaxy regions as functions of E/G ratios, wherein the growth rates in FIG. 6A reflect the growth of SiGe in device region 200. It is appreciated that when the growth rates have negative values, the growth is equivalent to an etching. It is observed that when the E/G ratio increases, the epitaxy process enters into stages A, B, C1, C2, D, and E. Since some of these stages have the net growth effect and some have the net etching effect, stages A, B, C1, C2, D, and E are also referred to as growth/etching stages. The details in determining the dividing points Q, R, S, T, and U between different stages are shown in FIG. 6B.

Stage A is a fast epitaxy region with a high growth rate. However, the defect rate of the resulting SiGe formed with the corresponding growth being in stage A is also high. When the E/G ratio increases so that the epitaxy process goes into stage B, the growth rate is still high, and the defect rate of the corresponding grown SiGe is reduced compared to stage A. Accordingly, stage B may be used, while stage A is not used for growing SiGe in embodiments. The dividing point of stages A and B is point Q, at which the growth rate is the highest. In stage C1, a balance growth may be achieved, wherein due to the increase in the etching gas (and hence higher E/G ratio), the etching effect is increased, although the net effect is still a growth. The quality of the grown SiGe is high due to the relatively high etching effect.

Stage C2 is a balanced etching stage, wherein due to the further increase in etching gas, the etching effect exceeds that of growth, and hence the net effect is selective etching. Stage D is also a selective etching stage with both growth and etching effect exist at the same time, and the etching effect is further increased over that of stage C2. In stages C2 and D, self-pinning effect occurs, which means that in these growth/etching stages, the surfaces of the grown SiGe regions have the tendency of being pinned to stable crystal surface planes such as (001) planes. Accordingly, the abnormal growth may be etched away, and SiGe regions that are grown faster will be etched more than the regions grown slower. The thickness uniformity in SiGe regions throughout wafer 1 thus may be improved.

In stage E, the growth effect, if any, is negligible, and hence stage E is a pure etching stage or substantially pure etching stage. Growth/etching stage E may be achieved using in-situ pure dry etching in a reduction atmosphere (for example, using 99 percent hydrogen ($H_2$) gas). Growth/etching stage E can be performed before any SiGe regions are grown in recesses 118/218/318 (FIGS. 5A and 5B), so that silicon substrate 2 is etched, and the exposed surfaces of recesses 118/218/318 are pinned to stable surfaces including (111) and (001) surface planes. As a result, the angles between the surface planes of recesses 118/218/318 may be set to 54.7 degrees. Further, the effective channel lengths of the resulting MOS devices may be adjusted through stage E. By performing growth/etching stage E, recesses 118/218/318 may extend under the respective spacers, and hence the channel lengths of the resulting MOS devices may be reduced.

FIG. 6B schematically illustrates experiment results that revealed the growth rates of epitaxy as functions of E/G ratios, wherein the growth rates of SiGe in device regions 100 and 200 are shown. Line 400 schematically illustrates the behavior of the SiGe growth in device region 100, and line 402 schematically illustrates the behavior of the SiGe growth in device region 200. Although lines 400 and 402 are illustrated as being straight lines, they may actually be curved similar to what is shown in FIG. 6A. In the following discussed embodiments, it is assumed that line 400 represents the behavior of the largest recesses (for example, recesses 118 in FIG. 5B) in wafer 1, while line 402 represents the behavior of the smallest recesses (for example, recesses 218 in FIG. 5B) in wafer 1. Lines 400 and 402 revealed that when SiGe is grown in recesses of different sizes, depending on the sizes of the recesses, the growth/or etch behavior in different recesses may fall into different stages. For example, when the E/G ratio is greater than EG3 and smaller than EG4, line 400 is in a selective growth stage, while line 402 is in a selective etching stage. The marked stages A, B, C1, C2, D, and E are actually the stages of line 402, which is for the smallest recesses in the respective wafer. Reference E/G ratios EG1 through EG5 are marked to show the respective E/G ratios of dividing points Q, R, S, T, and U between stages A, B, C1, C2, D, and E.

Referring to FIG. 6B, the dividing point between stages A and B is point Q. In stage A, the growth rates in recesses 118 and 218 are high. The dividing point between stages B and C1 is point R, at which the growth in recesses 118 and 218 have the same growth rate. Accordingly, reference E/G ratio EG2 is also referred to as a uniform E/G ratio, and point R is referred to as a balance point. At the uniform E/G ratio, all recesses having different sizes may have substantially the same, or at least, similar, growth rate. Between E/G ratios EG1 and EG2, both lines 400 and 402 are in selective growth stages. The dividing point between stages C1 and C2 is point S (corresponding to EG3), at which line 402 enters a selective etching stage from a selective growth stage. However, line 400 is still in a selective growth stage. The dividing point between stages C2 and D is point T (corresponding to EG4), at which line 400 also enters into a selective etching stage from the selective growth stage. The dividing point between stages D and E is point U (corresponding to EG5), at which both lines 400 and 402 enters into substantially pure etch stages. Since E/G ratios EG1 through EG5 are related to the process used in the epitaxial growth, experiments may be performed to determine the values of E/G ratios EG1 through EG5. In an embodiment, experiment results revealed that in an exemplary embodiment wherein recesses 118 (FIG. 5B) have a length of 5 µm and a width of 0.05 µm, and recesses 218 (FIG. 5B) have a length of 0.05 µm and a width of 0.05 µm, E/G ratios EG1, EG2, EG3, EG4, and EG5 are about 0.1, 0.6, 1.2, 1.5, and 3.0, respectively.

FIG. 6B also schematically illustrates the behavior of germanium concentrations. For example, the germanium concentration of the SiGe grown from small recesses (such as recesses 218 in device region 200 in FIG. 5B) tend to have higher germanium concentrations than the germanium concentration of the SiGe grown from large recesses such as recesses 118. In the selective etching of the SiGe regions, the trend is reversed, and more germanium may be removed from the small recesses than from large recesses. Accordingly, by using stages C1 and/or C2 to grow SiGe regions, the germanium concentration throughout the respective chip/wafer may be more uniform, with the difference between large recesses and small recesses being smaller than about one percent, for example.

By combining the epitaxy growth/etching stages as shown in FIG. 6B into different combinations, the pattern loading effect in the epitaxy growth may be reduced, and the quality of the resulting epitaxy regions may be improved. FIGS. 7A through 7D illustrate the epitaxy regions formed using different combinations. In the discussion of FIGS. 7A through 7D, normalized flow rates of process gases are used, wherein the normalization is performed by dividing the flow rates of HCl and DCS by the flow rate of HCl used in grow stage B. The normalization of the flow rate of GeH4 is performed through dividing the flow rate of GeH4 by the flow rate of HCl in growth stage B, and then times 100. The E/G ratio may be calculated using Equation 2. For example, assuming that the flow rates of HCl, DCS, and GeH$_4$ are 50 sccm, 100 sccm, and 2 sccm, respectively, then the normalized flow rates of HCl, DCS, and GeH$_4$ are 1×, 2×, and 2×, respectively, and the E/G ratio according to Equation 2 is 1/6.

Figure 7A:
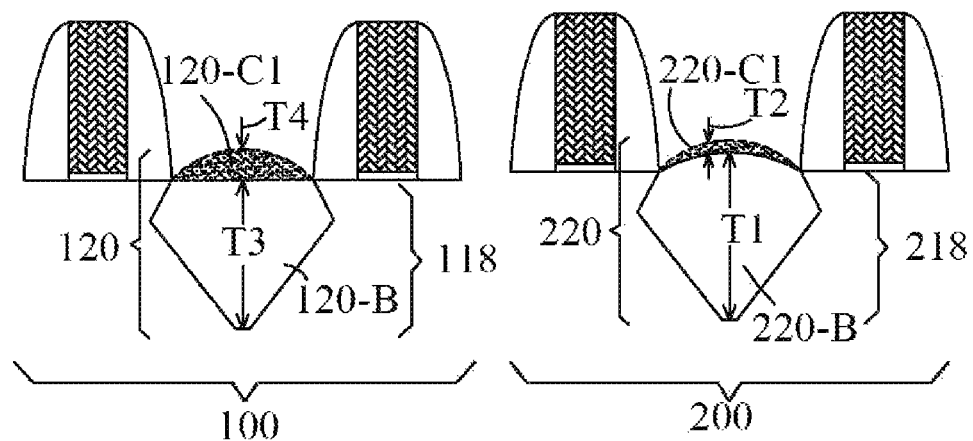

FIG. 7A illustrates SiGe regions 120 and 220 formed in recesses 118 and 218 (FIGS. 5A and 5B), respectively, wherein a first growth combination is used. In the first growth combination, SiGe regions 120-B and 220-B are first grown with the E/G ratio being set in stage B (FIG. 6B). In an exemplary embodiment, during the formation of regions 120-B and 220-B, the normalized flow rates of HCl, DCS, and GeH$_4$ are 1×, 2×, and 2×, respectively. Accordingly, per Equation 2, the E/G ratio is 0.25.

Figure 8A:
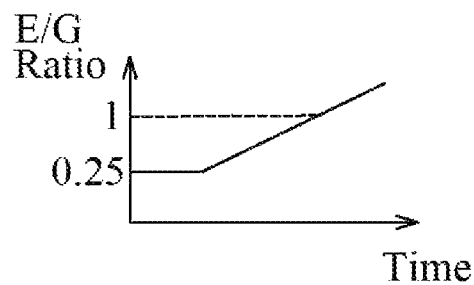
FIG. 8A through 8D illustrate exemplary E/G ratios in various growth/etching stages.

Next, the process condition is adjusted, and the composition of the etching gas is increased so that the growth of SiGe is changed to the growth of regions 120-C1 and 220-C1. In an exemplary embodiment, during stage C1 (FIG. 6), the normalized flow rates of HCl, DCS, and GeH$_4$ are 2×, 1×, and 1×, respectively. Accordingly, per Equation 2, the E/G ratio is 1. The flow rates of process gases may be changed gradually to reduce the abrupt change in the composition in the resulting SiGe regions. FIG. 8A illustrates exemplary E/G ratios corresponding to FIG. 7A, wherein the E/G ratios are shown as a function of time. In an embodiment, the E/G ratio increases gradually with time, and goes into stage C1 from stage B.

As shown in FIG. 7A, during stage B, since line 402 in stage B has higher growth rates than line 400 in stage B (FIG. 6B), the resulting SiGe region 220-B has a greater thickness T1 than thickness T3 of SiGe region 120-B. Conversely, during stage C1, since line 402 in stage C1 has lower growth rates than line 400 (FIG. 6B), the resulting SiGe region 220-C1 has a smaller thickness T2 than thickness T4 of SiGe region 120-C1. Accordingly, the differences in the growth rates in growth stages B and C1 compensate for each other, and hence the total thickness T3+T4 of SiGe region 120 may be adjusted to substantially equal to thickness T1+T2 of SiGe region 220. The adjustment of thicknesses of T1, T2, T3, and T4 may be achieved by adjusting the durations of the epitaxy process in stages B and/or C1, and/or the E/G ratios in stages B and/or C1.

Figure 7B:
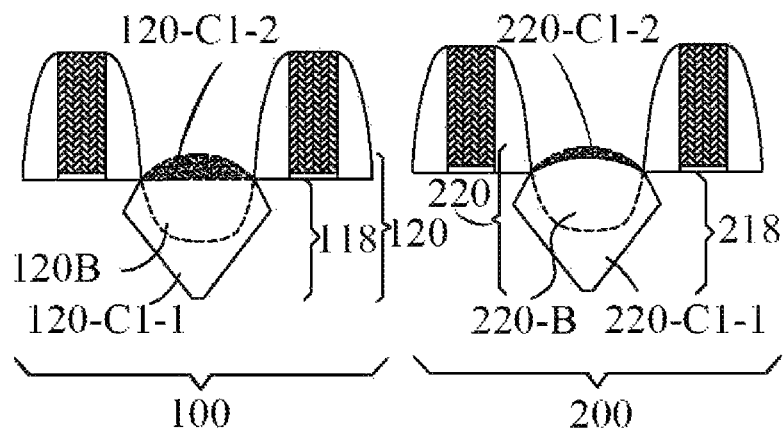

FIG. 7B illustrates SiGe regions 120 and 220 formed in recesses 118 and 218 (FIGS. 5A and 5B), respectively, wherein a second growth combination is used. In the second growth combination, SiGe regions 120-C1-1 and 220-C1-1 are first grown with the respective E/G ratio being set in stage C1 in FIG. 6B. In an exemplary embodiment, during the formation of SiGe regions 120-C1-1 and 220-C1-1, the normalized flow rates of HCl, DCS, and GeH$_4$ are 4×, 2×, and 2×, respectively. Accordingly, per Equation 2, the E/G ratio is 1.0.

Next, the process condition is adjusted, and the composition of the etching gas is reduced so that the growth of SiGe is changed to grow regions 120-B and 220-B, during which the E/G ratio is in stage B. In an exemplary embodiment, during stage B for forming regions 120-B and 220-B, the normalized flow rates of HCl, DCS, and GeH$_4$ are 1×, 1×, and 1×, respectively. Accordingly, per Equation 2, the E/G ratio is 0.5.

Figure 8B:
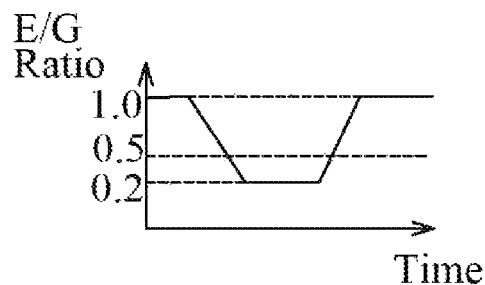

Next, the process condition is further adjusted, and the composition of the etching gas is increased so that the formation of SiGe is changed to form regions 120-C1-2 and 220-C1-2 with the respective E/G ratio being set in stage C1 in FIG. 6B. In an exemplary embodiment, during the stage C1 for forming regions 120-C1-2 and 220-C1-2, the normalized flow rates of HCl, DCS, and GeH$_4$ are 2×, 1×, and 1×, respectively. Accordingly, per Equation 2, the E/G ratio is 1.0. FIG. 8B illustrates an exemplary E/G ratio profile in the second growth combination, wherein E/G ratios are illustrated as a function of time.

As shown in FIG. 7B, during stage B, SiGe region 220-B has a greater thickness than the thickness of SiGe region 120-B. Conversely, during the two growth/etching stages C1, the resulting SiGe regions 220-C1-1 and 220-C1-2 have smaller thicknesses than the thicknesses of the respective SiGe region 120-C1-1 and 120-C1-2. Accordingly, the differences in growth rates in growth stage B and growth stages C1 compensate for each other, and hence the total thickness of SiGe region 120 may be adjusted to substantially equal to the thickness of SiGe region 220. The adjustment in the thicknesses of SiGe regions 120 and 220 may be achieved by adjusting the duration of stages B and/or C1, and/or the E/G ratios in stages B and/or C1.

Figure 7C:
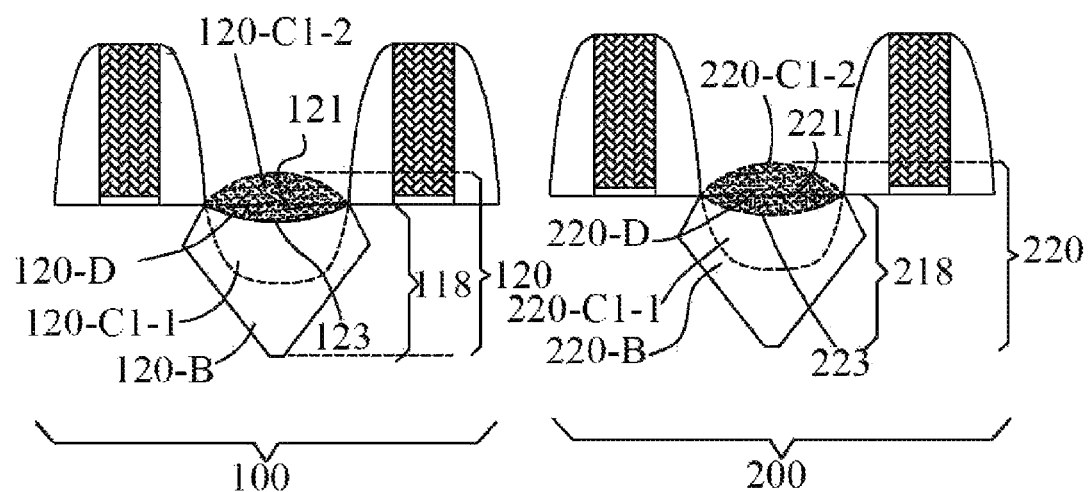

FIG. 7C illustrates SiGe regions 120 and 220 formed in recesses 118 and 218 (FIGS. 5A and 5B), respectively, wherein a third growth combination is used. SiGe regions 120-B and 220-B are first grown with the E/G ratio being set in stage B. In an exemplary embodiment, during the stage B for forming SiGe regions 120-B and 220-B, the normalized flow rates of HCl, DCS, and GeH$_4$ are 1×, 1×, and 2×, respectively. Accordingly, per Equation 2, the E/G ratio is 0.33.

Next, the process condition is adjusted, and the composition of the etching gas is increased so that the growth of SiGe is changed to grow SiGe regions 120-C1 and 220-C1 with the E/G ration being set in stage C1. Dotted lines 121 and 221 schematically illustrate the top surfaces of SiGe regions 120-C1 and 220-C1, respectively. In an exemplary embodiment, during stage C1, the normalized flow rates of HCl, DCS, and GeH$_4$ are 2×, 1×, and 1×, respectively. Accordingly, per Equation 2, the E/G ratio is 1. The flow rates of process gases may be changed gradually to reduce the abrupt change in the composition in the resulting SiGe regions.

A growth/etching stage D is then performed to remove portions of SiGe regions (marked as SiGe regions 120-D and 220-D) from the previously grown SiGe regions 120 and 220, respectively. In an exemplary embodiment, during stage D, the normalized flow rates of HCl, DCS, and GeH$_4$ are 4×, 1×, and 1×, respectively. Accordingly, per Equation 2, the E/G ratio is 2.0. In stage D, selective etching is performed in both device regions 100 and 200, and hence the top surface of SiGe region 120 is reduced from position 121 to position 123, and the top surface of SiGe region 220 is reduced from position 221 to position 223. The selective etching reduces or substantially removes the likely abnormal growth of SiGe regions 120 and 220, so that SiGe regions 120 and 220 may have an improved quality. Besides, the selective etching could reduce SiGe region abnormal growth due to layout or other process excursions.

Next, the process condition is further adjusted, and the composition of the etching gas is reduced so that the formation of SiGe is changed to grow regions 120-C1-2 and 220-C1-2 with the E/G ratio being set in stage C1, which growth starts from positions 123 and 223, respectively. In an exemplary embodiment, during this specific stage C1, the normalized flow rates of HCl, DCS, and GeH$_4$ are 2×, 1×, and 1×, respectively. Accordingly, per Equation 2, the E/G ratio is 1.0.

Figure 8C:
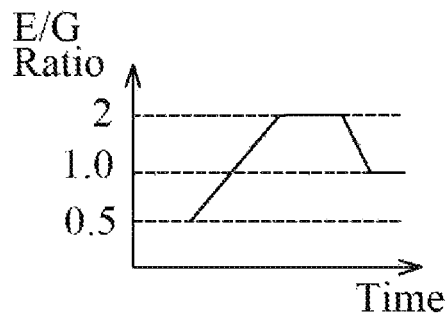

During growth/etching stage B, the thickness of SiGe region 220 is grown to be greater than the thickness of SiGe region 120. The two growth/etching stages C1 cause the difference in the thicknesses of SiGe regions 120 and 220 to be reduced partially. Furthermore, during growth stage D, the thickness of SiGe region 220 is reduced more than that of SiGe region 120. Accordingly, the combined effect of stages B, C1, D, and C1 may result in a same thickness in SiGe regions 120 and 220. The adjustment in the thicknesses of SiGe regions 120 and 220 may be achieved by adjusting the duration of stages B, C1, D, and C1, and/or the E/G ratios in these stages. FIG. 8C illustrates an exemplary E/G ratio profile in the third growth combination as shown in FIG. 7C, wherein E/G ratios are illustrated as a function of time.

An additional embodiment may be similar to the embodiment as shown in FIG. 7C, except that stage B is performed, followed by stage D. Stages C1 as in FIG. 7C, however, are omitted. Through this combination, SiGe regions 120 and 220 may also have substantially the same thickness.

Figure 7D:
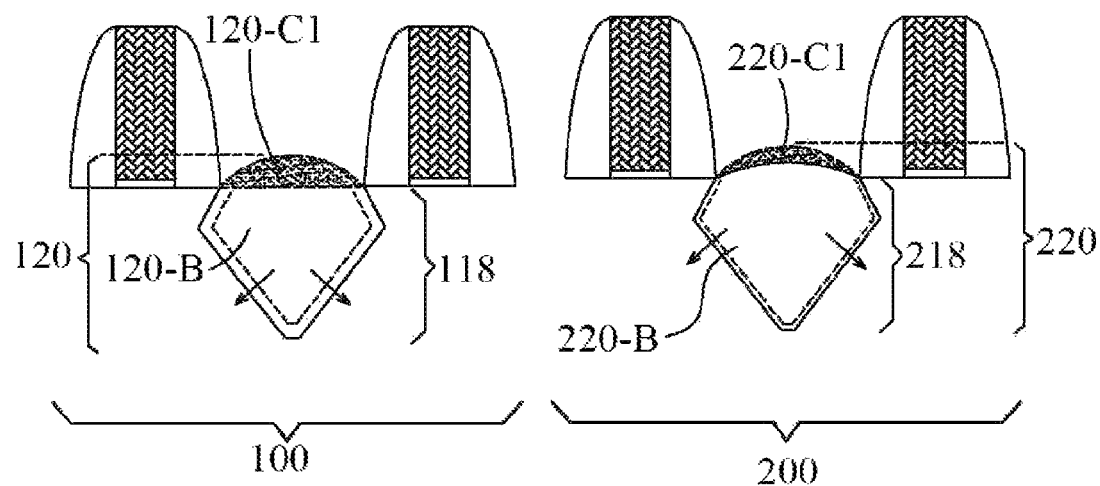

FIG. 7D illustrates SiGe regions 120 and 220 formed in recesses 118 and 218 (FIGS. 5A and 5B), respectively, wherein a fourth growth combination is used. In the fourth growth combination, stage E for pure etch stage is first performed, so that the profile of recesses 118 and 218 is improved, and the surface planes of recesses 118 and 218 are pinned (symbolized by arrows) to stable crystal surface planes such as (001) and (111) planes. Accordingly, the resulting SiGe regions subsequently grown in recesses 118 and 218 may have an improved quality. In one embodiment, stage D is performed instead of stage E. Stage D selectively etches the surface planes of recesses 118 and 218 so that the profile of recesses 118 and 218 is improved.

Next, SiGe regions 120-B and 220-B are grown with the E/G ratio being set to stage B in FIG. 6B. In an exemplary embodiment, during growth/etching stage B, the normalized flow rates of HCl, DCS, and GeH$_4$ are 1×, 1×, and 2×, respectively. Accordingly, per Equation 2, the E/G ratio is 0.33.

Figure 8D:
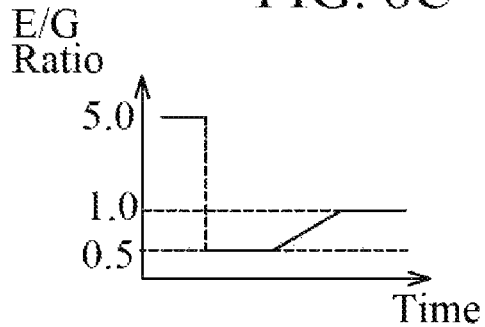

Next, the process condition is adjusted, and the composition of the etching gas is increased so that the growth of SiGe is changed to form regions 120-C1 and 220-C1 with the E/G ratio being set to stage C1. In an exemplary embodiment, during stage C1, the normalized flow rates of HCl, DCS, and GeH$_4$ are 2×, 1×, and 1×, respectively. Accordingly, per Equation 2, the E/G ratio is 1. Thicknesses of SiGe regions 120 and 220 may be adjusted by adjusting the duration of stages B and/or C1, and/or the E/G ratios in stages B and/or C1, so that a uniform thickness may be achieved for SiGe regions throughout the respective wafer. FIG. 8D illustrates an exemplary E/G ratio profile in the fourth growth combination as shown in FIG. 7D, wherein E/G ratios are illustrated as a function of time.

Figure 7E:
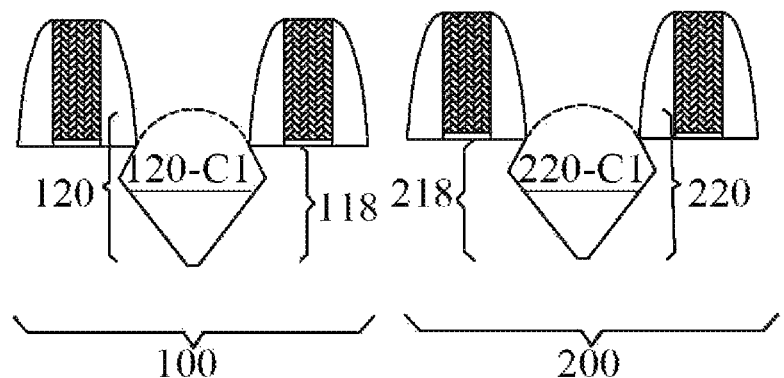

Referring to FIG. 7E, the growth of SiGe regions 120 and 220 is performed using the process conditions in stage C1, with the E/G ratio of the growth close to the E/G ratio EG2 at balance point R as shown in FIG. 6B. The resulting SiGe regions 120 and 220 are illustrated as 120-C1 and 220-C1, respectively. In an exemplary embodiment, assuming the E/G ratio for growing SiGe regions 120 and 220 is EG', the difference (EG'−EG2)/EG2 may be smaller than about 0.2, and may be smaller than about 0.1. Since the balance point R is the point SiGe regions 120 and 220 have the same growth rate, as the E/G ratio close to EG2 at balance point R as in FIG. 6B, the resulting SiGe regions 120 and 220 have substantially the same thickness. In addition, the germanium concentrations in SiGe regions 120 and 220 will be close to each other.

Figure 7F:
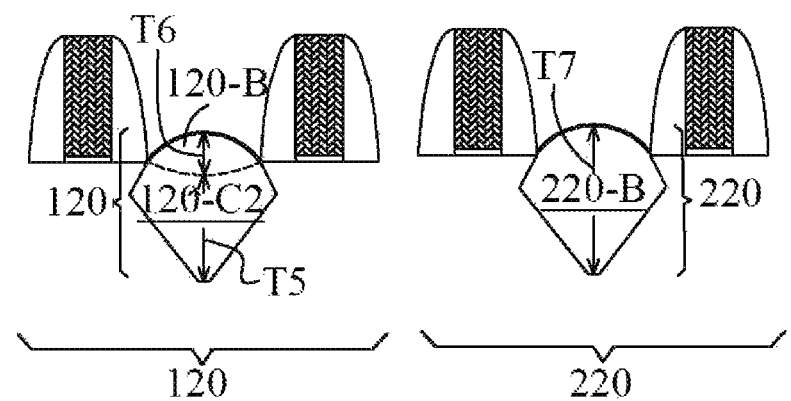

FIG. 7F illustrates SiGe regions 120 and 220 formed in recesses 118 and 218 (FIGS. 5A and 5B), respectively, wherein a fifth growth combination is used. In the fifth growth combination, C2 stage is perform first so that a selective growth is performed in recesses 118, while a selective etching is simultaneously performed in recesses 218. The etching rate in recesses 218 is low. Therefore, the net effect is similar to growing SiGe regions 120 in recesses 118, while no SiGe is grown in recesses 218. The respective SiGe 120 in recesses 118 is referred to as SiGe regions 120-C2. The thickness T5 of SiGe regions 120-C2 is related to the difference in growth rates in subsequently performed SiGe growth in stage B.

Next, SiGe regions 120-B and 220-B are grown with the E/G ratio being set to stage B in FIG. 6B. In an exemplary embodiment, during growth/etching stage B, the normalized flow rates of HCl, DCS, and GeH$_4$ are 1×, 1×, and 2×, respectively. Accordingly, per Equation 2, the E/G ratio is 0.33.

As shown in FIG. 6B, in stage B, the growth rate of SiGe regions 120-B (FIG. 7F) is lower than the growth rate of SiGe regions 220-B. Accordingly, thickness T6 of SiGe regions 120-B is smaller than thickness T7 of SiGe regions 220-B. With the proceeding in the growth of SiGe regions 120-B and 220-B, the difference between the thicknesses of SiGe regions 120 and 220 becomes increasingly smaller, and eventually, the thicknesses of SiGe regions 120 and 220 will be equal.

In the above-discussed embodiments as shown in FIG. 7F, the materials of regions 120B and 220B may be different from the material of regions 120-C2. For example, the germanium concentrations of regions 120B and 220B may be different from that of regions 120-C2. Alternatively, one of regions 120B/220B and 120-C2 may be silicon germanium regions, while the other regions may be silicon regions, silicon carbon regions, or the like.

In each of the growth combinations, the orders of the stages in the respective combinations may be changed to other possible combinations. It is also appreciated that FIGS. 7A through 7D illustrate samples of various possible combinations. One skilled in the art will realize that there are various additional combinations that may be used to achieve a uniform SiGe growth and to form SiGe regions with improved quality.

Figure 9A:
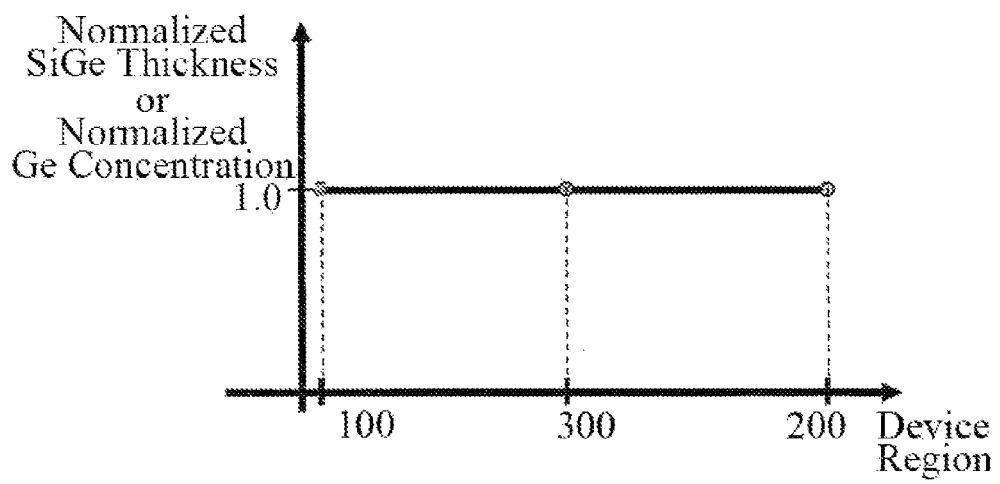
FIGS. 9A through 9C illustrate the normalized growth rates in various regions.
Figure 9B:
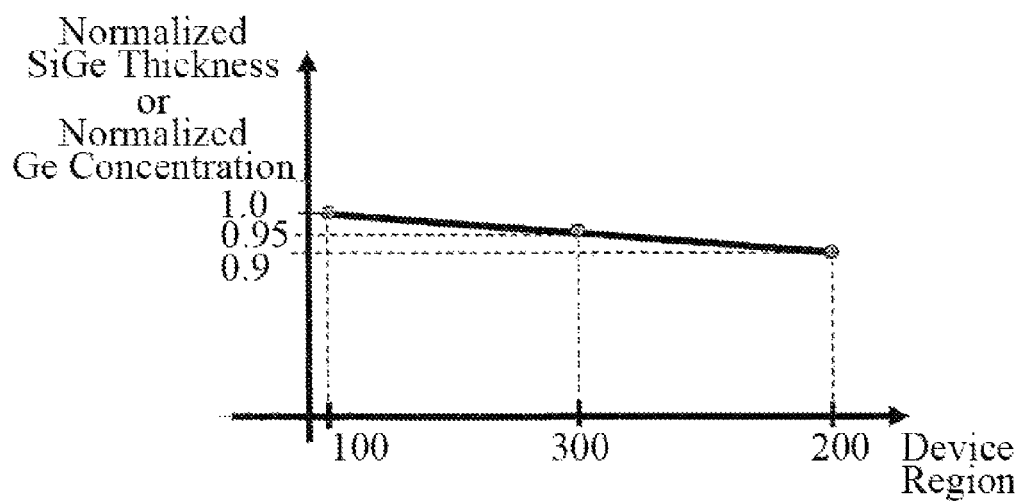
Figure 9C:
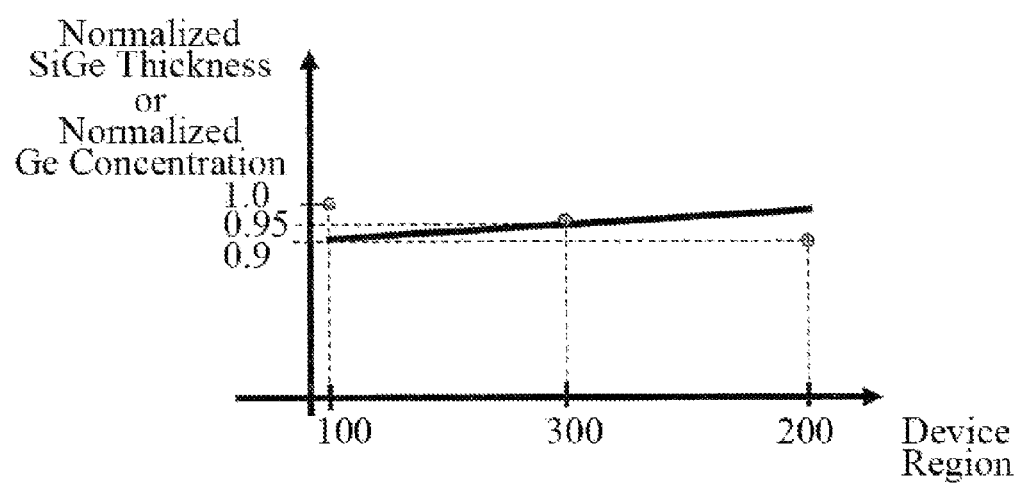

FIGS. 9A through 9C illustrate the normalized SiGe thicknesses (or normalized Ge concentrations in the grown SiGe regions) in device regions 100, 200, and 300. By using the embodiments shown in FIGS. 7A through 7D, as shown in FIG. 9A, a uniform thickness may be achieved for regions 100 and 200. When recesses 118 in device region 100 and recesses 218 in device regions 200 are the largest and the smallest SiGe regions, respectively in the respective wafer, achieving a uniform SiGe growth for regions 100 and 200 also means that any SiGe region (device regions 300) having recess sizes between that of device regions 100 and 200 will also have a similar thickness as that in device regions 100 and 200. Accordingly, across the entire wafer, a uniform thickness of SiGe regions may be achieved and SiGe growth variation can be reduced.

In some embodiments, the thickness profile as shown in FIG. 9B may be needed, wherein the SiGe regions in device region 200 may have a smaller thickness than the SiGe regions in device region 100. Conversely, in some other embodiments, the thickness profile as shown in FIG. 9C may be needed, wherein the SiGe regions in device region 100 may have a smaller thickness than the SiGe regions in device region 200. For example, it may be desired that the thicknesses of the SiGe regions in device regions 100 and 200 have a difference of about 10 percent, for example. It is realized that by applying the teaching of the embodiments, the thickness profiles as shown in FIGS. 9A, 9B, and 9C may be achieved.

Although FIGS. 6A through 8D illustrate the growth of SiGe regions, the teaching may be applied to the epitaxial growth of other semiconductor materials such as SiC, silicon, or the like. Accordingly, experiments may be performed to find the process conditions including the process gases and the partial pressures (or flow rates) for each growth/etching stages as shown in FIGS. 6A and 6B. The process conditions corresponding to the growth/etching stages may then be used to derive different combinations of the growth/etching stages. Accordingly, a uniform growth throughout a wafer and an improved quality in the grown material may be achieved.

Figure 10:
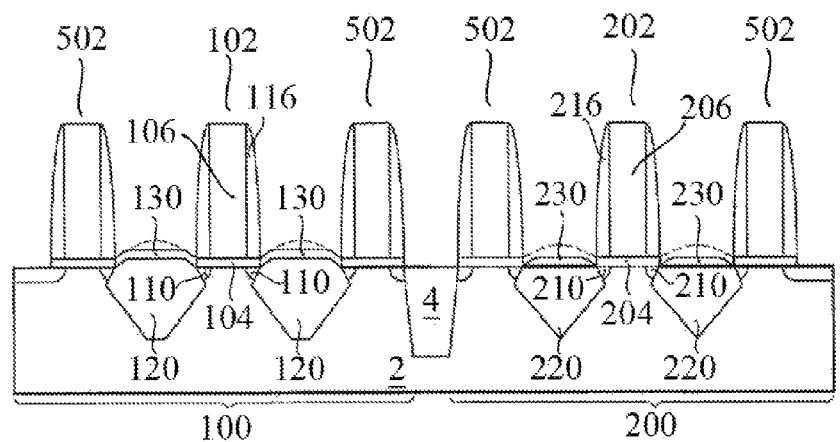

FIG. 10 illustrates the formation of silicon caps or SiGe caps 130 and 230 (referred to as Si/SiGe caps, or silicon-containing caps hereinafter), which may also be formed using selective epitaxial growth. When germanium is contained in silicon-containing caps, the germanium atomic percentage in silicon-containing caps 130 and 230 will be lower than the germanium atomic percentage in the respective underlying SiGe regions 120 and 220, respectively. Further, the germanium atomic percentage in silicon-containing caps 130 and 230 may be lower than about 20 percent. Silicon-containing caps 130 and 230 are beneficial for the subsequent formation of source and drain silicide regions due to the low resistivity of silicide formed on silicon rather than on SiGe. The process gases for forming silicon-containing caps 130 and 230 may include silane ($SiH_4$) and HCl. Again, in the selective growth of silicon-containing caps 130 and 230, both growth and etch back exist, while the net effect is growth. Facets may also be formed on silicon-containing caps 130 and 230. Accordingly, similar to the formation of SiGe regions 120 and 220, after the selective growth of silicon-containing caps 130 and 230, an optional selective etch-back may be performed to reduce the pattern-loading effect and to improve the profiles of silicon-containing caps 130 and 230. The dotted lines schematically illustrate the profile of silicon-containing caps 130 and 230 at the time the selective etch-back starts, while the profile of silicon-containing caps 130 and 230 after the selective etch-back is illustrated using solid lines. Again, the selective etch-back of silicon-containing caps 130 and 230 may be in-situ performed with the respective selective growth. In the selective etch-back of silicon-containing caps 130 and 230, both growth and etch-back exist, while the net effect is etch-back. The transition from selective growth to selective etch-back may be achieved by adjusting the process conditions such as increasing the partial pressure of HCl and/or reducing the partial pressure of silane.

Figure 11:
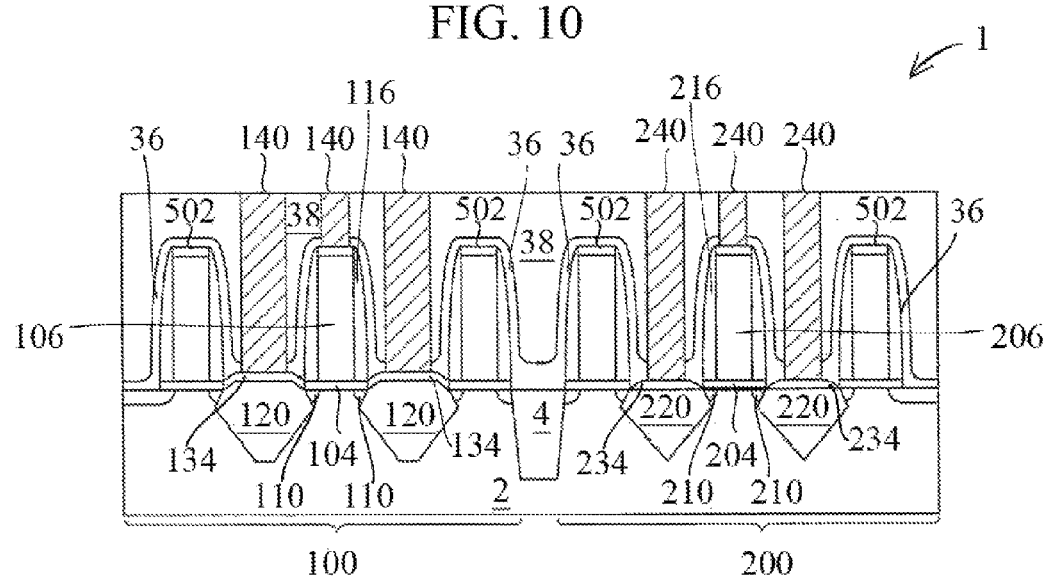

FIG. 11 illustrates the formation of silicide regions 134 and 234, etch stop layer (ESL) 36, and contact plugs 140 and 240. Silicide regions 134 and 234 may be formed by depositing a thin layer of metal, such as titanium, cobalt, nickel, or the like, over the devices, including the exposed surfaces of silicon-containing caps 130 and 230 and gate electrode 106 and 206. Wafer 1 is then heated, which causes the silicide reaction to occur wherever the metal is in contact with silicon. After the reaction, a layer of metal silicide is formed between silicon and metal. The un-reacted metal is selectively removed through the use of an etchant that attacks metal but does not attack silicide. Further, no contact plugs are formed to connect to dummy gate stacks 502.

ESL 36 is blanket deposited. ESL 36 may be formed using plasma enhanced chemical vapor deposition (PECVD), but other CVD methods, such as low pressure chemical vapor deposition (LPCVD), and thermal CVD may also be used. Inter-level dielectric (ILD) 38 is next deposited. ILD layer 38 may comprise boronphospho-silicate glass (BPSG) or other applicable materials. ILD layer 38 provides insulation between MOS devices and overlying metal lines. Contact plugs 140 and 240 are then formed providing access to the source/drain region and gate electrodes through silicide regions 134 and 234.

In the above-discussed embodiments, the growth of SiGe stressors for planar devices is illustrated. The teaching, however, may also be applied to the growth of SiGe stressors for fin field-effect transistors (FinFETs). The process may include forming a gate stack on a semiconductor fin (not shown), etching the exposed portions of the semiconductor fin not covered by the gate stack, and performing a selective growth followed by a selective etch-back to form SiGe stressors. The process details may be realized through the teaching in the embodiments, and hence are not discussed herein. In addition, the teaching of the embodiments may also be applied to the formation of stressors (such as SiC stressors) for NMOS devices. The selective etch-back as discussed in the preceding embodiments, besides used for the formation of CMOS devices, bipolar junction transistors (BJTs) may also be used for the formation other devices such as solar cell, micro-electro-mechanical-systems (MEMS) devices, micro-optical structures, etc.

In the above-illustrated embodiments, epitaxial regions are grown from recesses formed in semiconductor substrates. In the formation of some other integrated circuit structures, such as the formation of MEMS devices or micro-optical structures, epitaxial semiconductor regions such as epitaxial SiGe regions may grown on the surface of semiconductor substrates or other semiconductor materials formed over semiconductor substrates, rather than from inside recesses. In these embodiments, the epitaxial semiconductor regions may not be formed as source/drain regions, and hence may not be adjacent to gate stacks of MOS transistors. The respective formation processes and the materials may be essentially the same as illustrated in FIGS. 6A through 9C, and as provided in the discussion of the respective embodiments.

In the embodiments, by reducing pattern-loading effects through the selective etch-back processes, more uniform formation of epitaxy regions (such as SiGe stressors) is achieved, and the profiles of the epitaxy regions are improved. The (111) facets pinning of the epitaxy regions can be reduced, or even substantially eliminated. Additionally, the selective etch-back can be performed in-situ with the selective growth, thus minimal extra cost is involved and SiGe growth variation can be reduced.

In accordance with embodiments, a method includes forming a gate stack over a semiconductor substrate in a wafer; forming a recess in the semiconductor substrate and adjacent the gate stack; and performing a selective epitaxial growth to grow a semiconductor material in the recess to form an epitaxy region. The step of performing the selective epitaxial growth includes performing a first growth stage with a first E/G ratio of process gases used in the first growth stage; and performing a second growth stage with a second E/G ratio of process gases used in the second growth stage different from the first E/G ratio.

In accordance with other embodiments, a method includes a forming a first gate stack and a second gate stack over a semiconductor substrate in a wafer; and forming a first recess and a second recess in the semiconductor substrate and adjacent the first and the second gate stacks, respectively. The first recess has an area greater than an area of the second recess. The method further includes performing a selective epitaxial growth to grow a semiconductor material in the first recess and the second recess. The step of performing the selective epitaxial growth includes performing a first and a second growth stage. In the first growth stage, a first growth rate of the semiconductor material in the first recess is greater than a second growth rate of the semiconductor material in the second recess. In the second growth stage, a third growth rate of the semiconductor material in the first recess is smaller than a fourth growth rate of the semiconductor material in the second recess.

In accordance with yet other embodiments, a method includes forming a gate stack over a semiconductor substrate in a wafer; forming a recess in the semiconductor substrate and adjacent the gate stack; and performing a selective epitaxial growth to grow SiGe in the recess using process gases comprising GeH$_4$, HCl, and dichloro silane (DCS). The step of performing the selective epitaxial growth includes performing a first growth/etching stage with a first E/G ratio of the process gases used in the first growth stage; and performing a second growth/etching stage with a second E/G ratio of the process gases used in the second growth stage different from the first E/G ratio. The first and the second E/G ratios are calculated using an equation:

$$E/G\ ratio = FR_{HCl}/(FR_{DCS} + 100 \times FR_{GeH4})$$

wherein $FR_{HCl}$, $FR_{DCS}$, and $FR_{GeH4}$ are flow rates of HCl, DCS, and GeH$_4$, respectively, and wherein the first E/G ratio is smaller than 0.6, and the second E/G ratio is greater than 0.6.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    performing a selective epitaxial growth to form an epitaxy region adjacent a surface of a semiconductor substrate, wherein the step of performing the selective epitaxial growth comprises:
        performing a first growth stage with a first growth-to-etching (E/G) ratio of process gases used in the first growth stage; and
        performing a second growth stage with a second E/G ratio of process gases used in the second growth stage, wherein the first E/G ratio is smaller than a uniform growth E/G ratio, and the second E/G ratio is greater than the uniform growth E/G ratio.

2. The method of claim 1 further comprising:
    forming a gate stack over the semiconductor substrate; and
    forming a recess in the semiconductor substrate and adjacent the gate stack, wherein the epitaxy region comprises at least a portion in the recess.

3. The method of claim 2 further comprising, before performing the selective epitaxial growth, performing a step to the recess with process gases used in etching, the process gases comprise at least one of etching gases and growth gases.

4. The method of claim 1, wherein the second growth stage is performed after the first growth stage.

5. The method of claim 1 further comprising performing a selective etching stage after at least one of the first and the second growth stages.

6. The method of claim 5, wherein during the selective etching stage, a largest epitaxial semiconductor region and a smallest epitaxial semiconductor region formed by the selective epitaxial growth are both etched.

7. The method of claim 1, wherein a plurality of epitaxial semiconductor regions separated from each other are formed by the step of performing the selective epitaxial growth, and wherein during a growth wherein process gases used in the growth have the uniform growth E/G ratio, a largest epitaxial semiconductor region among the plurality of epitaxial semiconductor regions has a substantially same growth rate as a smallest epitaxial semiconductor region among the plurality of epitaxial semiconductor regions.

8. The method of claim 7 further comprising, before the step of performing the first growth stage, performing a third growth stage with a third E/G ratio of process gases used in the third growth stage greater than the uniform growth E/G ratio.

9. The method of claim 7, wherein process gases used in the selective epitaxial growth are selected from the group consisting essentially of GeH$_4$, HCl, dichloro silane (DCS), and combinations thereof, and wherein the first E/G ratio, the second E/G ratio, and the uniform growth E/G ratio are calculated using an equation:

$$E/G\ ratio = FR_{HCl}/(FR_{DCS} + 100 \times FR_{GeH4})$$

wherein $FR_{HCl}$, $FR_{DCS}$, and $FR_{GeH4}$ are flow rates of HCl, DCS, and GeH$_4$, respectively.

10. The method of claim 7, wherein the uniform growth E/G ratio is equal to about 0.6.

11. A method comprising:
    performing a selective epitaxial growth to grow a semiconductor material at a surface of a semiconductor substrate of a wafer, wherein the semiconductor material forms a first epitaxial region and a second epitaxial region greater than, and separated from the first epitaxial region, and wherein the step of performing the selective epitaxial growth comprises:
        performing a first growth stage, wherein in the first growth stage, a first growth rate of the semiconductor material in the first epitaxial region is greater than a second growth rate of the semiconductor material in the second epitaxial region; and
        performing a second growth stage, wherein in the second growth stage, a third growth rate of the semiconductor material in the first epitaxial region is smaller than a fourth growth rate of the semiconductor material in the second epitaxial region.

12. The method of claim 11 further comprising:
    forming a first gate stack and a second gate stack over a semiconductor substrate in a wafer; and
    forming a first recess and a second recess in the semiconductor substrate and adjacent the first and the second gate stacks, respectively, wherein the first epitaxial region has at least a portion in the first recess, and the second epitaxial region has at least a portion in the second recess.

13. The method of claim 11, wherein the first epitaxial region is the largest epitaxial region in the wafer, and the second epitaxial region is the smallest epitaxial region in the wafer.

14. The method of claim 13, wherein during the first growth stage, a first E/G ratio is used, and during the second stage, a second E/G ratio is used, wherein the first E/G ratio is greater than a uniform growth growth-to-etching (E/G) ratio, and the second E/G ratio is smaller than the uniform growth E/G ratio, and wherein the first and the second epitaxial regions have a same growth rate at the uniform growth E/G ratio.

15. The method of claim 14, wherein the semiconductor material is SiGe, and wherein the first E/G ratio is smaller than 0.6, and the second E/G ratio is greater than 0.6.

16. The method of claim 15, wherein the first E/G ratio is further greater than about 0.1, and the second E/G ratio is further smaller than about 1.2.

17. The method of claim 15, wherein the selective epitaxial growth further comprises a selective etching stage, and wherein the semiconductor material is etched from both the first and the second epitaxial regions during the selective etching stage.

18. A method comprising:
  forming a gate stack over a semiconductor substrate in a wafer;
  forming a recess in the semiconductor substrate and adjacent the gate stack; and
  performing a selective epitaxial growth to grow silicon germanium (SiGe) in the recess using process gases comprising $GeH_4$, HCl, and dichloro silane (DCS), wherein the step of performing the selective epitaxial growth comprises:
    performing a first growth/etching stage with a first growth-to-etching (E/G) ratio of the process gases used in the first growth/etching stage; and
    performing a second growth/etching stage with a second E/G ratio of the process gases used in the second growth/etching stage different from the first E/G ratio, wherein the first and the second E/G ratios are calculated using an equation:

$$E/G\ \text{ratio} = FR_{HCl}/(FR_{DCS} + 100 \times FR_{GeH4})$$

wherein $FR_{HCl}$, $FR_{DCS}$, and $FR_{GeH4}$ are flow rates of HCl, DCS, and $GeH_4$, respectively, and
   wherein the first E/G ratio is smaller than 0.6, and the second E/G ratio is greater than 0.6.

19. The method of claim 18, wherein in the first and the second growth/etching stages, SiGe is grown in the recess.

20. The method of claim 18, wherein in the first growth/etching stage, SiGe is grown in the recess, and in the second growth/etching stage, SiGe is etched from the recess.

21. The method of claim 18, wherein the second E/G ratio is greater than about 1.5.

22. The method of claim 18 further comprising, before the steps of performing the first and the second growth/etching stages, performing an etching to the recess, wherein an E/G ratio of the etching is greater than about 1.5.

* * * * *